(12) United States Patent
Hsue et al.

(10) Patent No.: US 6,492,226 B1
(45) Date of Patent: Dec. 10, 2002

(54) METHOD FOR FORMING A METAL CAPACITOR IN A DAMASCENE PROCESS

(75) Inventors: Chen-Chiu Hsue, Hsinchu (TW); Shyh-Dar Lee, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 09/880,849

(22) Filed: Jun. 15, 2001

(51) Int. Cl.$^7$ ............................................. H01L 21/8264
(52) U.S. Cl. ....................... 438/253; 438/396; 438/303
(58) Field of Search ................................. 438/253–256, 438/396–398; 257/301–305

(56) References Cited

U.S. PATENT DOCUMENTS 6,391,713 B1 * 5/2002 Hsue et al. .................. 438/253
6,410,386 B1 * 6/2002 Hsue et al. .................. 438/253

* cited by examiner

*Primary Examiner*—David Nelms
*Assistant Examiner*—Dung A Le
(74) *Attorney, Agent, or Firm*—Birch, Stewart, Kolasch & Birch, LLP

(57) ABSTRACT

This invention provides a method for forming a metal capacitor in a damascene process. Before the thin-film capacitor is formed, the underlying interconnections are fabricated with Cu metal by damascene process. The lower electrode is formed in a dual damascene process, which is also used to form the dual damascene structures comprising wires and plugs. An insulator is disposed to isolate the dual damascene structures with each other. In this dual damascene process, an anti-reflection layer is used and formed on the insulator, and the anti-reflection layer is also used as a hard mask layer, a polishing stop layer and an etching stop layer. Then, another insulator and a metal layer are formed on the anti-reflection layer, and encounter a photolithography step and an etching step to obtain an upper electrode and a capacitor insulator. After forming the metal capacitor, the upper interconnections are fabricated with another dual damascene processes.

12 Claims, 10 Drawing Sheets

METHOD FOR FORMING A METAL CAPACITOR IN A DAMASCENE PROCESS

BACKGROUND OF THE INVENTION

1. Field of the Invention

The present invention relates in general to the formation of an integrated circuit including capacitors. In particular, the present invention relates to a method for forming a metal capacitor in a damascene process.

2. Description of the Related Art

Capacitors are deployed in various integrated circuits. For example, decoupling capacitors provide improved voltage regulation and noise immunity for power distribution. Capacitors also have wide applications in analog/logic, analog-to-digital, mixed signal, radio frequency circuit operations, and others.

A conventional method of manufacturing a semiconductor apparatus including a capacitor 20 that is formed of metal-insulator-metal layers is described with reference to FIGS. 1A~1D. As shown in FIG. 1A, an aluminum layer is deposited on an insulator 12 which contains interconnections and is formed on a silicon substrate having devices (not shown) thereon and therein. The aluminum layer is then patterned by masking and etching to form wires 14a and 14b. As shown in FIG. 1B, an insulator 16 with a tungsten plug 18 (hereafter "W-plug") used to connect the aluminum wire 14a and the to-be-formed capacitor is formed on the aluminum wires 14a and 14b and the insulator 12. As shown in FIG. 1C, a first conductive plate 21, an insulator 22 and a second conductive plate 23 are sequentially deposited on the insulator 16 and the W-plug 18, and then patterned by masking and etching to obtain a capacitor 20. The first conductive plate 21, the lower electrode, is connected with the aluminum wire 14a through the W-plug 18. Another insulator 26 is deposited on the insulator 16 and the capacitor 20. The insulators 16 and 26 are patterned and W-plug 28a and W-plug 28b are formed therein. As shown in FIG. 1D, an aluminum layer is deposited on the insulator 26 and the W-plugs 28a and 28b. The aluminum layer is then patterned by masking and etching to form wires 34a and 34b. The aluminum wire 34a is connected with the second conductive plate 23 through the W-plug 28a. The aluminum wire 34b is connected with the aluminum wire 14b through the W-plug 28b.

The above-mentioned traditional processes for integrating the capacitor 20 into an integrated circuit require several masking and etching steps to form the capacitor 20, which may increase overall fabrication costs.

As well, the aluminum used to fabricate the traditional interconnections cannot satisfy present-day requirements for enhanced integration and highly demanding speed of data transmission. Copper (Cu) has high electric conductivity to reduce RC delay and can be substituted for the aluminum in the conducting wires. The use of copper in the conducting wires requires the use of processes, that is, damascene processes, because copper cannot be patterned by etching. This is because the boiling point of the copper chloride ($CuCl_2$) produced by copper and the chlorine plasma usually used to etch metal is relatively high, about 1500° C.

SUMMARY OF THE INVENTION

It is an object of the present invention to provide a method for forming a metal capacitor in a damascene process.

It is another object of the invention to reduce the number of masking and etching steps in manufacturing an integrated circuit including a capacitor.

Yet another object of the invention is to reduce the cost of manufacturing an integrated circuit including a capacitor.

Still another object of the invention is to provide easily controllable processes in manufacturing an integrated circuit including a capacitor.

Another object of the invention is to use the Cu processes to fabricate the integrated circuit including capacitors to reduce RC delay.

The present invention provides a method for forming a metal capacitor with a damascene process. Before fabricating the thin-film capacitor, a first Cu wire and a second Cu wire are prepared in a first insulator. A first sealing layer is formed on the first insulator and the first and second Cu wires. A second insulator and an anti-reflection layer are formed on the first sealing layer sequentially. The dual damascene structures including first and second Cu plugs and third and fourth Cu wires are formed in the anti-reflection layer, the second insulator and the first sealing layer, wherein the first Cu plug connects the third Cu wire and the first Cu wire, and the second Cu plug connects the fourth Cu wire and the second Cu wire. A third insulator and a metal layer are formed on the anti-reflection layer and the third and fourth Cu wires in turn. The metal layer and the third insulator are patterned by using the anti-reflection layer as an etching stop layer to form a upper electrode and a capacitor insulator corresponding to the third Cu wire. A fourth insulator is formed on the anti-reflector layer and the upper electrode. An additional dual damascene structures including third and fourth Cu plug and fifth and sixth Cu wires are formed in the fourth insulator, wherein the third Cu plug connects the fifth Cu wire and the upper electrode, and the fourth Cu plug connects the sixth Cu wire and the fourth Cu wire. A second sealing layer is formed, covering at least the fifth and sixth Cu wires.

The present invention provides another method for forming a metal capacitor with a damascene process. Before fabricating the thin-film capacitor, a first Cu wire and a second Cu wire are prepared in a first insulator. A first sealing layer is formed covering at least the first and second Cu wires. A second insulator and an anti-reflection layer are formed on the first sealing layer, sequentially. Dual damascene structures including first and second Cu plugs and third and fourth Cu wires are formed in the anti-reflection layer, the second insulator and the first sealing layer, wherein the first Cu plug connects the third Cu wire and the first Cu wire, and the second Cu plug connects the fourth Cu wire and the second Cu wire. A second sealing layer, a third insulator and a metal layer are formed on the anti-reflection layer and the third and fourth Cu wires sequentially. The metal layer and the third insulator are patterned using the second sealing layer as an etching stop layer to form a upper electrode and one part of a capacitor insulator corresponding to the third Cu wire, wherein the second sealing layer is the other part of the capacitor insulator. A fourth insulator is formed on the second sealing layer and the upper electrode. Additional dual damascene structures including third and fourth Cu plug and fifth and sixth Cu wires are formed in the fourth insulator and the second sealing layer, wherein the third Cu plug connects the fifth Cu wire and the upper electrode, and the fourth Cu plug connects the sixth Cu wire and the fourth Cu wire. A third sealing layer is formed at least on the fifth and sixth Cu wires.

These and other objects of the present invention will become readily apparent upon further review of the following specification and drawings.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

The present invention provides a method for forming a metal capacitor in a Cu damascene process.
First Embodiment
A method for forming a metal capacitor in a damascene process according to the first embodiment of the present invention is described below with reference to FIGS. 2A–2H.

Figure 1A:
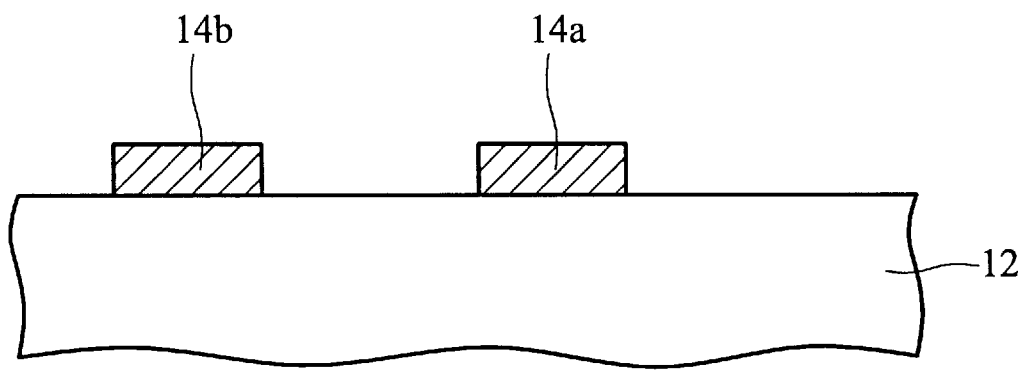
FIGS. 1A–1D depict the method for integrating the capacitors into the interconnection processes according to the prior art.
Figure 1B:
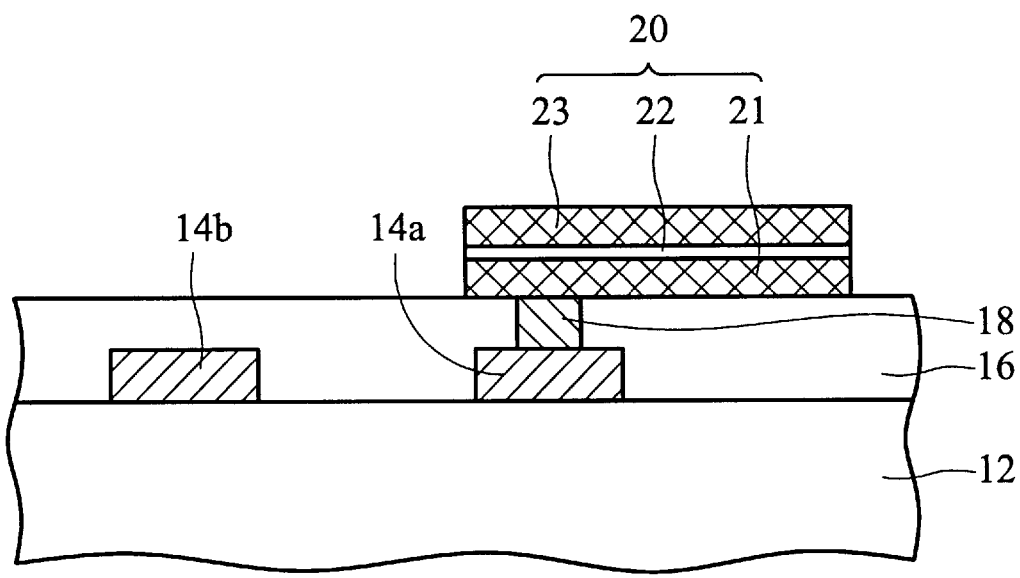
Figure 1C:
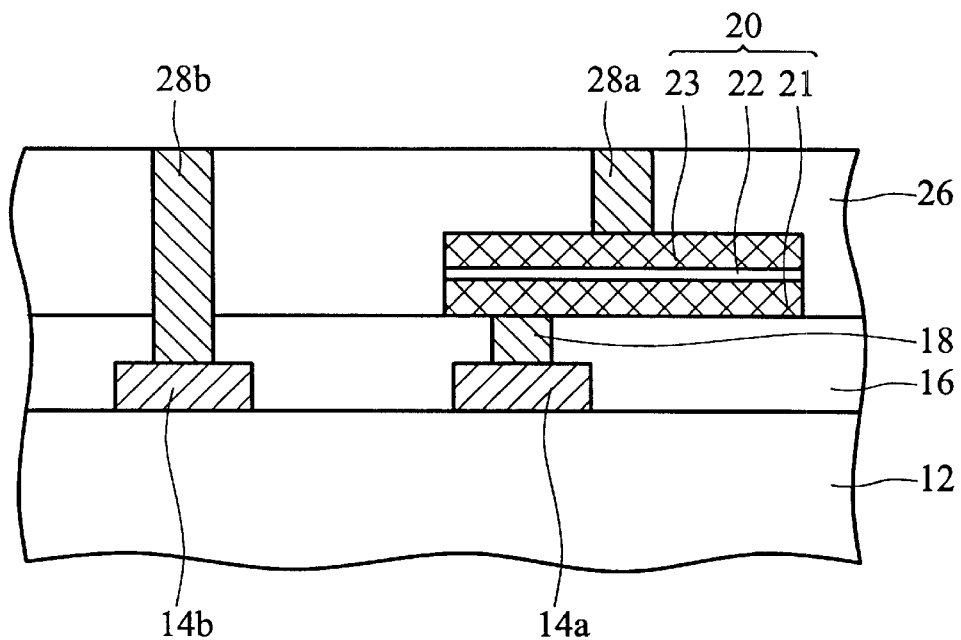
Figure 1D:
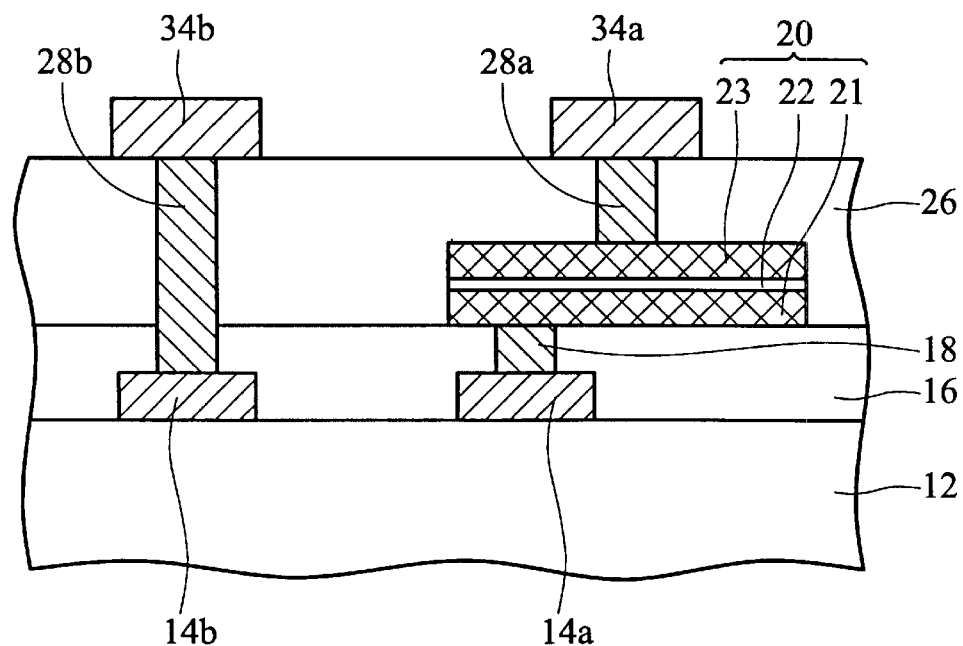
Figure 2A:
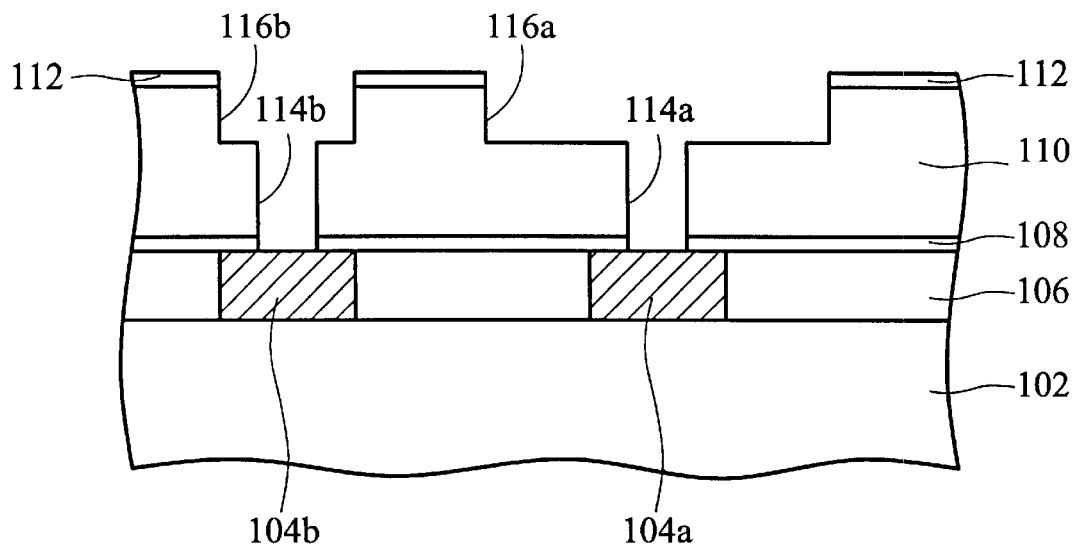
FIGS. 2A–2H depict the method for forming a metal capacitor in a damascene process according to the embodiment of the present invention.

Referring to FIG. 2A, the insulator 106 is formed on the insulator 102. The insulator 102 may include interconnections, and the insulator 102 is formed on a substrate, such as silicon semiconductor substrate, which includes numerous devices thereon and therein. The particular designs of the underlying integrated circuit have not been shown in order to more clearly describe and show the aspects of the present invention. Copper wires 104a and 104b, preferably about 2,000–6,000 Å, are formed in the insulator 106 by a damascene process. For example, first, trenches are formed in the insulator 106, and the barrier layer (not shown) is comformally formed on the insulator 106. After copper metal is formed on the barrier layer and fills in the trenches, a chemical mechanical polish process is executed to remove the undesirable copper and barrier layer. A sealing layer 108, preferably about 100–400 Å in thickness, is formed at least on the Cu wires 104a and 104b. In this figure the sealing layer 108 is formed on the insulator 106 and the Cu wires 104a and 104b as an example. The material of the sealing layer 108 can be silicon nitride or silicon carbide.

An insulator 110 is formed on the sealing layer 108. An anti-reflection layer 112 is formed on the insulator 110. The anti-reflection layer 112 also can be used as a hard mask when forming dual damascene structures, a polishing stop layer when forming Cu wires, and an etching stop layer when forming a upper electrode of the metal capacitor. The material used to form the anti-reflection layer 112 can be silicon oxynitride (SiON) or silicon carbide (SiC). The anti-reflection layer 112 has a thickness between 100 Å and 600 Å.

Dual damascene patterns comprising vias 114a and 114b and trenches 116a and 116b are formed in the anti-reflection layer 112, the insulator 110 and the sealing layer 108. The via 114b exposes the surface of the Cu wire 104b, and the via 114a expose the surface of the Cu wire 104a.

Figure 2B:
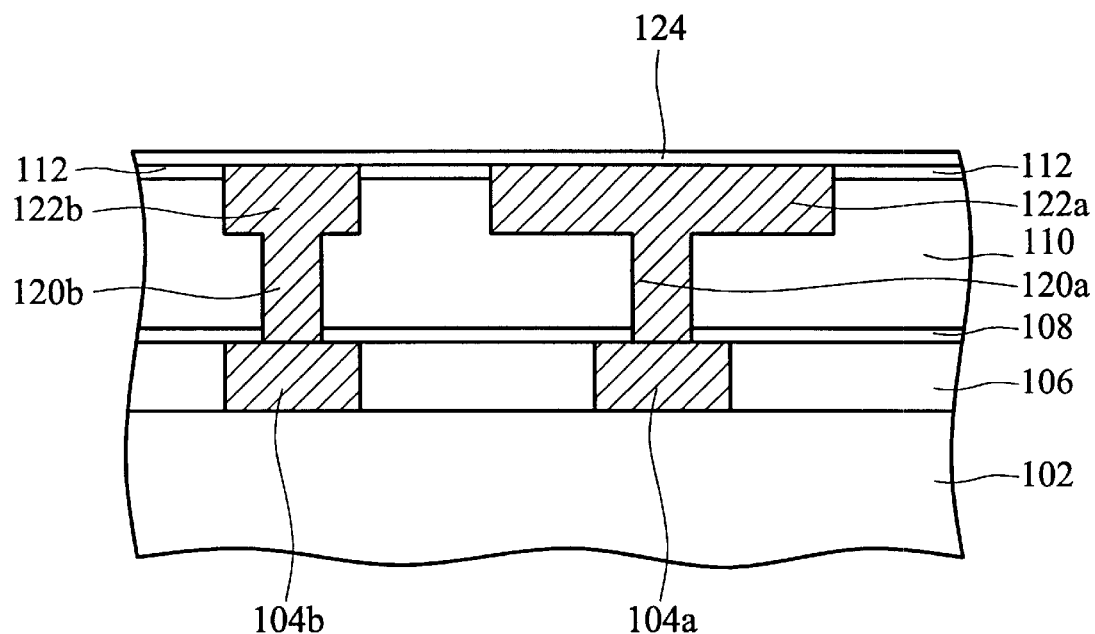

Referring to FIG. 2B, a barrier layer (not shown) is conformally formed on the anti-reflection layer 112 in the trenches 116a and 116b and vias 114a and 114b. Cu metal is formed above the barrier layer and fills the trenches 116a and 116b and vias 114a and 114b. A chemical mechanical polishing process is conducted to remove the unwanted Cu residue and the barrier layer to form dual damascene structures including Cu wires 122a and 122b and Cu plugs 120a and 120b with the anti-reflection layer 112 as a polishing stop layer. The Cu wire 122a is used as the lower electrode of the metal capacitor.

The lower electrode 122a is simultaneously formed with the wire 122b by the above-mentioned dual damascene process. Therefore, in the step of forming the lower electrode 122a, additional masking and etching steps are not required. Moreover, the lower electrode 122a is on the same plane as the wire 122b.

An insulator 124, which is used as a capacitor insulator of the metal capacitor, is formed on the anti-reflection layer 112 and the Cu wires 122a and 122b. The insulator 124, with a thickness ranging from 100 Å to 1,200 Å, is ready to form a capacitor insulator, however, the particular thickness of this insulator 124 depends on a particular application of the capacitor with a desired capacitance. The material used to fabricate the insulator 124 has a high dielectric constant, and can be silicon nitride ($Si_3N_4$), siliconoxynitride (SiON), silicon carbide (SiC), tantalum oxide ($TaO_2$), zirconium oxide ($ZrO_2$), hafnium oxide ($HfO_2$), aluminum oxide ($Al_2O_3$) or other high dielectric constant materials.

Figure 2C:
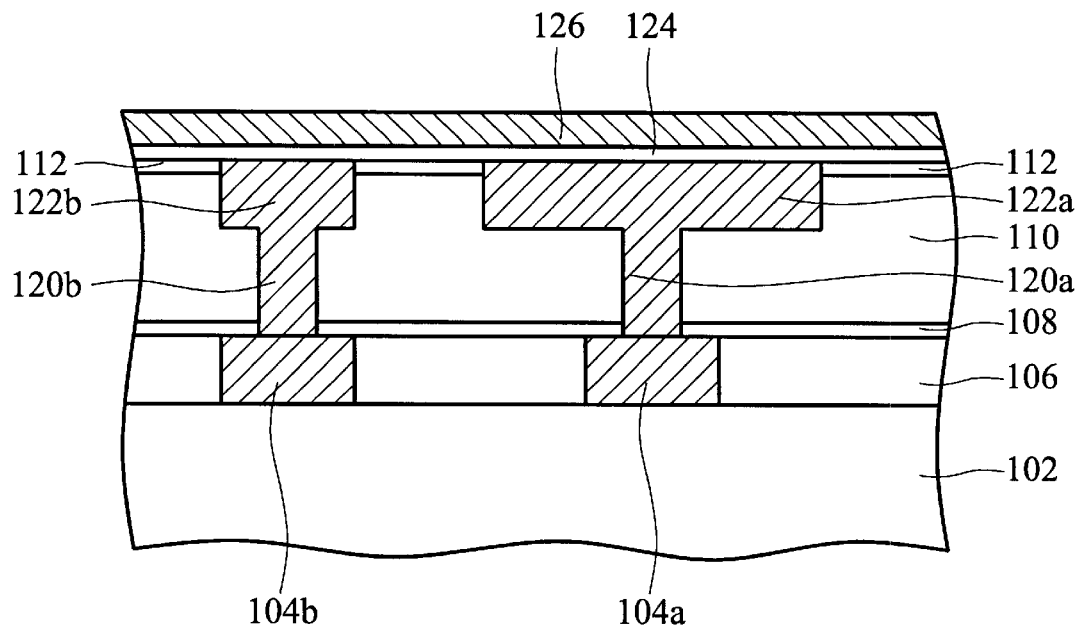

With Reference to FIG. 2C, a metal layer 126 is formed on the insulator 124. The metal layer 126, with a thickness ranging from 100 Å to 2,000 Å, will function as the upper electrode of the metal capacitor. The material used to form the metal layer 126 can be titanium (Ti), titanium nitride (TiN), tantalum (Ta), tantalum nitride (TaN), aluminum (Al), aluminum copper alloy (AlCu), and others.

Figure 2D:
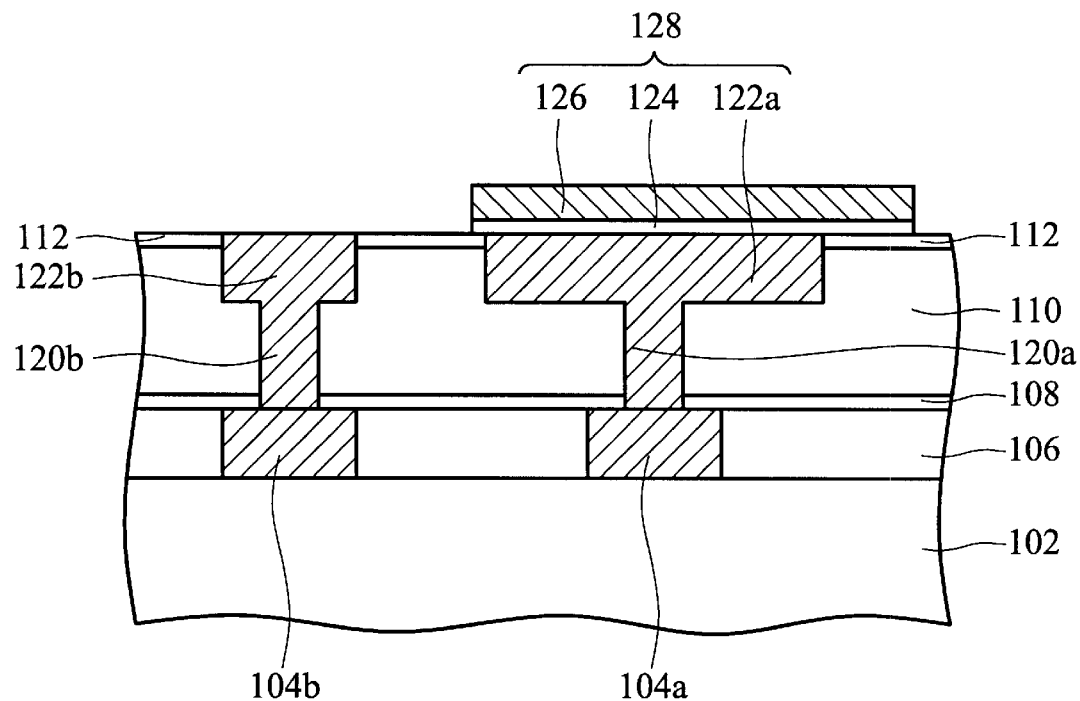

With Reference to FIG. 2D, the metal layer 126 and the insulator 124 are patterned to form an upper electrode 126 and a capacitor insulator 124 by proceeding a photolithography step and an etching step until the anti-reflection layer 112 as an etching stop layer is exposed.

According to the above-mentioned steps, only another single mask is required to make the metal capacitor 128. Accordingly, the number of masking and etching steps in manufacturing an integrated circuit including a capacitor is reduced, as is the cost of manufacturing the same.

The region of the lower electrode 122a corresponds roughly to that of the upper electrode 126, and the latter is equal to or larger than the former. The upper electrode 126, the capacitor insulator 124 and the lower electrode 122a comprise the metal capacitor 128.

Figure 2E:
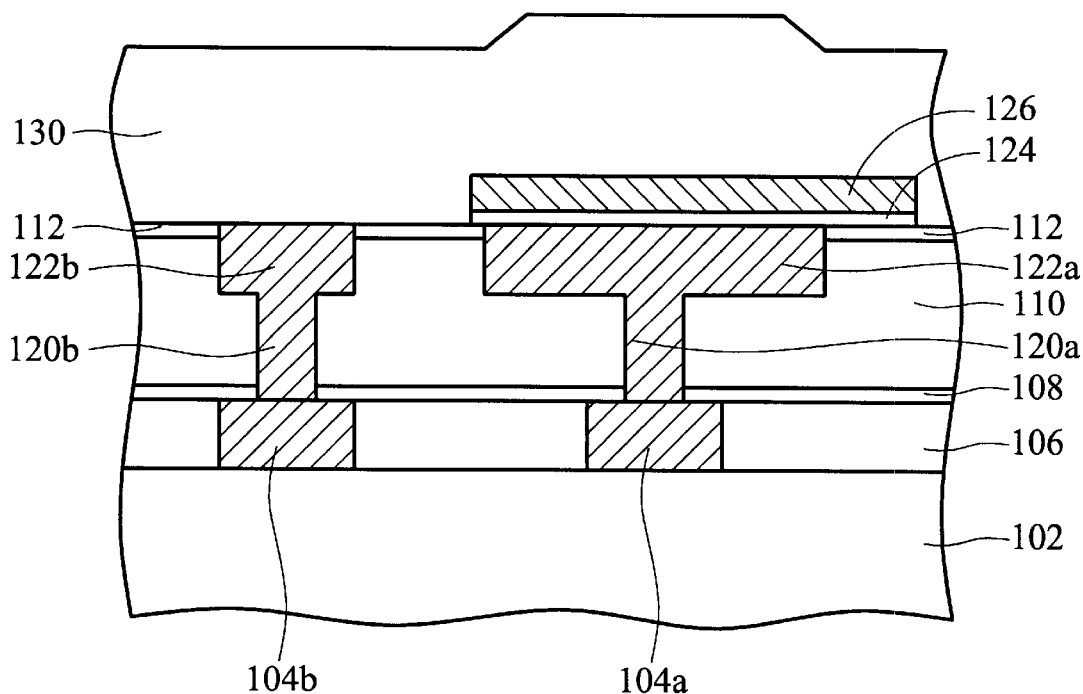
Figure 2F:
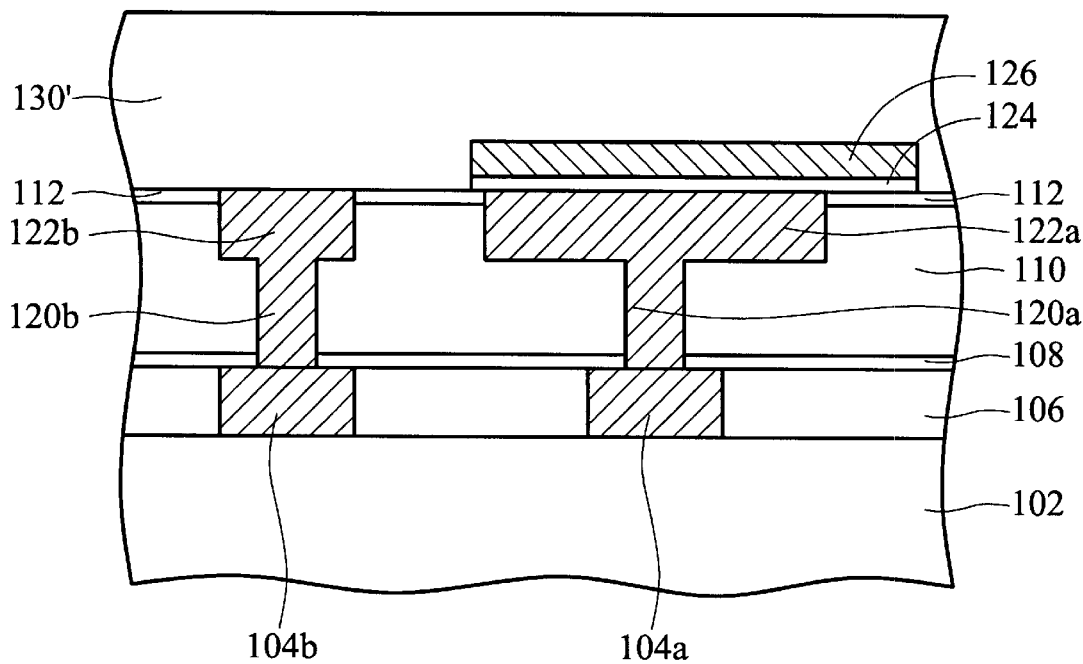

Now turning to FIG. 2E, a blanket sacrificial insulator 130 is formed on the anti-reflection layer 112 and the metal capacitor 128. The blanket sacrificial insulator 130 is then subjected to a planarization process, such as a chemical mechanical polishing process. The sacrificial insulator 130 thus becomes an insulator 130' having a flat surface to facilitate the following process, as shown in FIG. 2F.

Figure 2G:
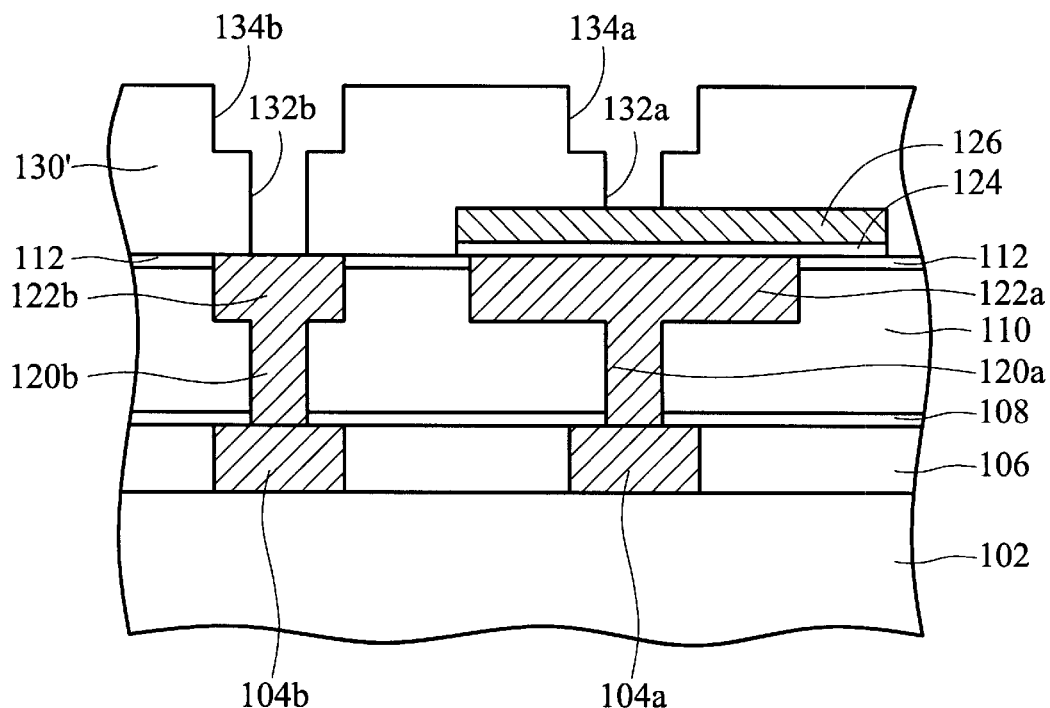
Figure 2H:
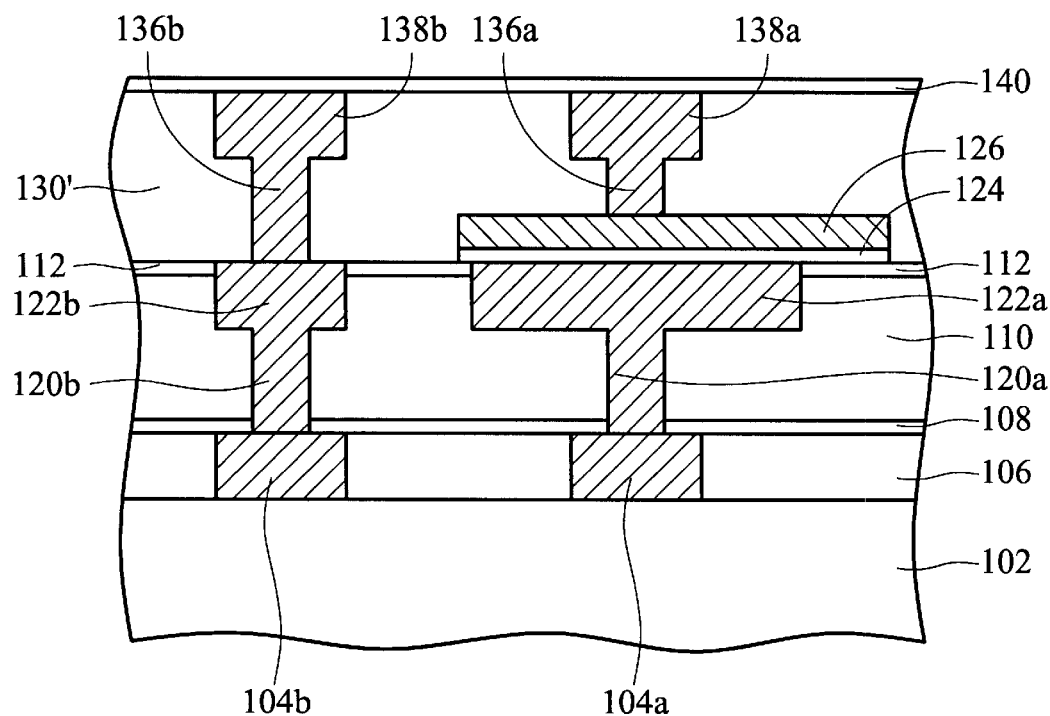

Another dual damascene process is performed, as shown in FIGS. 2G and 2H. Dual damascene patterns comprising vias 132a and 132b and trenches 134a and 134b are formed in the insulator 130'. The via 132b exposes the surface of the Cu wire 122b, and the via 132a exposes the surface of the upper electrode 126.

Referring to FIG. 2H, a barrier layer (not shown) is conformally formed on the insulator 130' in the trenches 134a and 134b and vias 132a and 132b. Cu metal is formed above the barrier layer and fills the trenches 134a and 134b and vias 132a and 132b. A chemical mechanical polishing process is conducted to remove the unwanted Cu residue and the barrier layer to form dual damascene structures including Cu wires 138a and 138b and Cu plugs 136a and 136b. A sealing layer 140 is formed on the insulator 130' and the Cu wires 138a and 138b. The material used to fabricate the sealing layer 140 can be silicon nitride or silicon carbide. The upper electrode 126 is connected with the Cu wire 138a through the Cu plug 136a, and the Cu wire 122b is connected with the Cu wire 138b through the Cu plug 136b.

The sequential interconnection processes, and specifically Cu processes, proceed until completion of all interconnections.

The above-mentioned insulators 102, 106, 110 and 130 can be formed by low dielectric constant (K) materials, such as doped or undoped silicon oxide, SOP low K material, such as FLARE®, SILK®, PAE-II® and so on, and CVD low K material, such as Blackdiamond™ (BD™), Coral™, Greendot™, Aurora™ and others.

Second Embodiment

A method for forming a metal capacitor in a damascene process according to the first embodiment of the present invention is described below with reference to FIGS. 3A~3H.

Figure 3A:
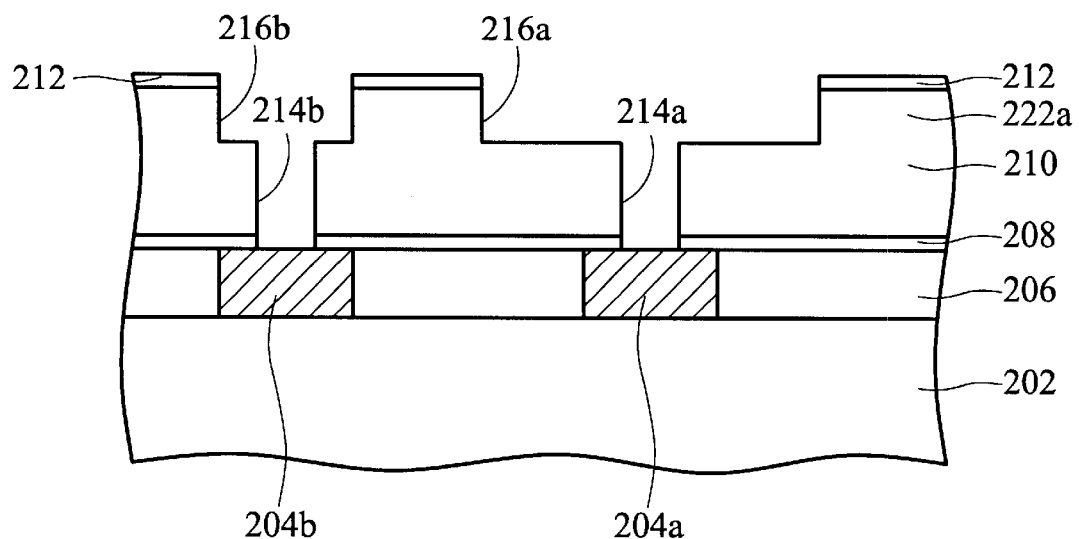
FIGS. 3A–3H depict the method for forming a metal capacitor in a damascene process according to another embodiment of the present invention.
Figure 3B:
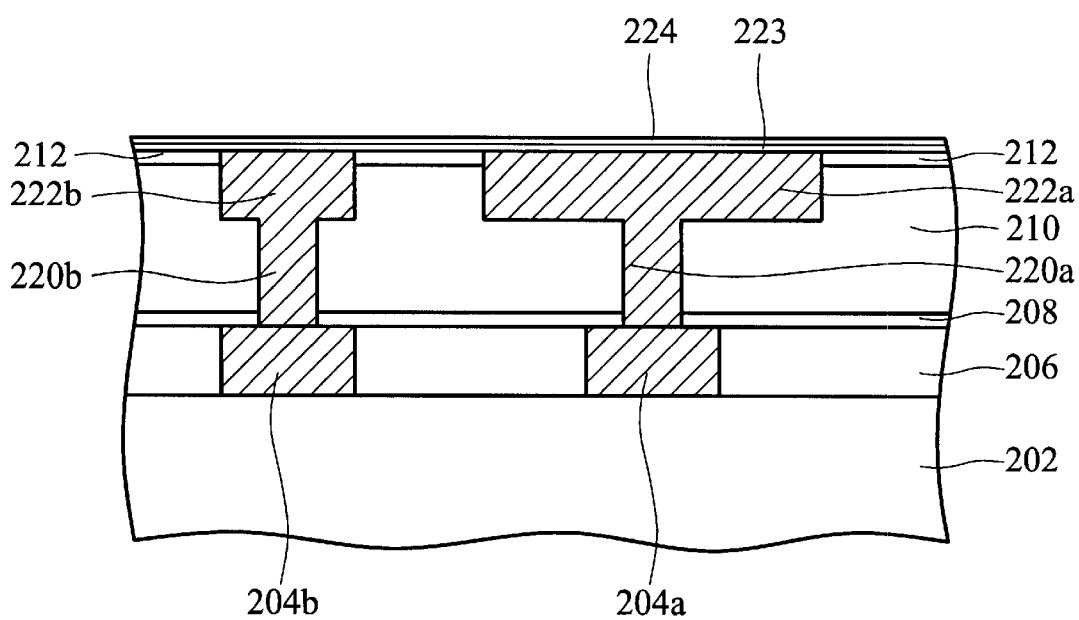

Referring to FIG. 3A, the insulator 206 is formed on the insulator 202. The insulator 202 may include interconnections, and the insulator 202 is formed on a substrate, such as silicon semiconductor substrate, which includes numerous devices thereon and therein. The particular designs of the underlying integrated circuit have not been shown in order to more clearly describe and show the aspects of the present invention. Copper wires 204a and 204b, preferably about 2,000~6000 Å, are formed in the insulator 206 by a damascene process. For example, first, trenches are formed in the insulator 206, and the barrier layer (not shown) is comformally formed on the insulator 206. After copper metal is formed on the barrier layer and fills the trenches, a chemical mechanical polish process is executed to remove the undesirable copper and barrier layer. A sealing layer 208, preferably about 100~400 Å in thickness, is formed at least on the Cu wires 204a and 204b. In this figure the sealing layer 208 is formed on the insulator 206 and the Cu wires 204a and 204b as an example. The material of the sealing layer 208 can be silicon nitride or silicon carbide.

An insulator 210 is formed on the sealing layer 208. An anti-reflection layer 212 is formed on the insulator 210. The anti-reflection layer 212 also can be used as a hard mask when forming dual damascene structures, and a polishing stop layer when forming Cu wires. The material used to form the anti-reflection layer 212 can be silicon oxynitride (SiON), or silicon carbide (SiC). The anti-reflection layer 212 has a thickness between 100 Å and 600 Å.

Dual damascene patterns comprising vias 214a and 214b and trenches 216a and 216b are formed in the anti-reflection layer 212, the insulator 210 and the sealing layer 208. The via 214b exposes the surface of the Cu wire 204b, and the via 214a exposed the surface of the Cu wire 204a.

Referring to FIG. 33, a barrier layer (not shown) is conformally formed on the anti-reflection layer 212 in the trenches 216a and 216b and vias 214a and 214b. Cu metal is formed above the barrier layer and fills the trenches 216a and 216b and vias 214a and 214b. A chemical mechanical polishing process is conducted to remove the unwanted Cu residue and the barrier layer to form dual damascene structures including Cu wires 222a and 222b and Cu plugs 220a and 220b with the anti-reflection layer 212 as a polishing stop layer. The Cu wire 222a is used as the lower electrode of the metal capacitor.

The lower electrode 222a is simultaneously formed with the wire 222b by the above-mentioned dual damascene process. According to the step of forming the lower electrode 222a, another masking and etching step are not required. Moreover, the lower electrode 222a is at the same plane with the wire 222b.

A sealing layer 223, preferably about 100~400 Å in thickness, is formed on the anti-reflection layer 212 and the Cu wires 222a and 222b. The sealing layer 223 is used as a diffusion barrier layer to prevent the Cu atoms from migrating, an etching stop layer when forming the upper electrode of the metal capacitor, and one part of a capacitor insulator for the metal capacitor. The material used to form the sealing layer 223 can be silicon nitride or silicon carbide.

An insulator 224, of a high dielectric constant material, is formed on the sealing layer 223. The sealing layer 223 can improve the adhesion between the insulator 224 and the lower electrode 222a. The insulator 224, with a thickness ranging from 100 Å to 1,200 Å, is ready to form the other part of the capacitor insulator. However, the particular thickness of this insulator 224 depends on a particular application of the capacitor with a desired capacitance. The material used to fabricate the insulator 224 has a high dielectric constant, which can be silicon nitride ($Si_3N_4$), silicon oxynitride (SiON), silicon carbide (SiC), tantalum oxide ($TaO_2$), zirconium oxide ($ZrO_2$), hafnium oxide ($HfO_2$), aluminum oxide ($Al_2O_3$) or other high dielectric constant materials.

Figure 3C:
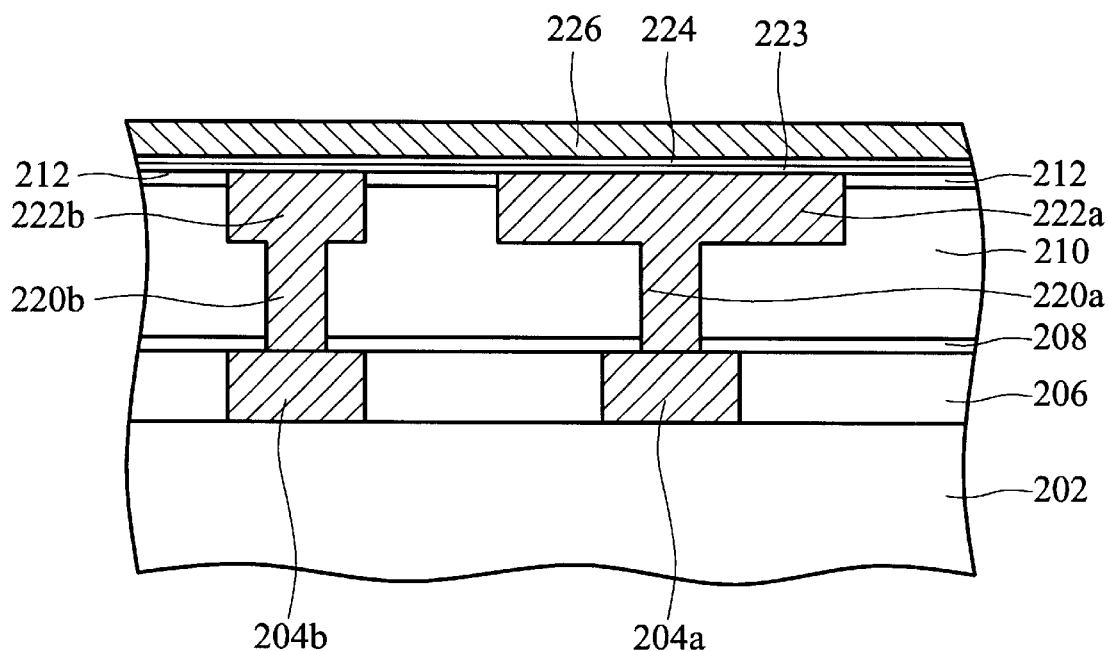

With Reference to FIG. 3C, a metal layer 226 is formed or the insulator 224. The metal layer 226, with a thickness ranging from 100 Å to 2,000 Å, is ready to form the upper electrode of the metal capacitor. The material used to form the metal layer 226 can be titanium (Ti), titanium nitride (TiN), tantalum (Ta), tantalum nitride (TaN), aluminum (Al), aluminum copper alloy (AlCu), or others.

Figure 3D:
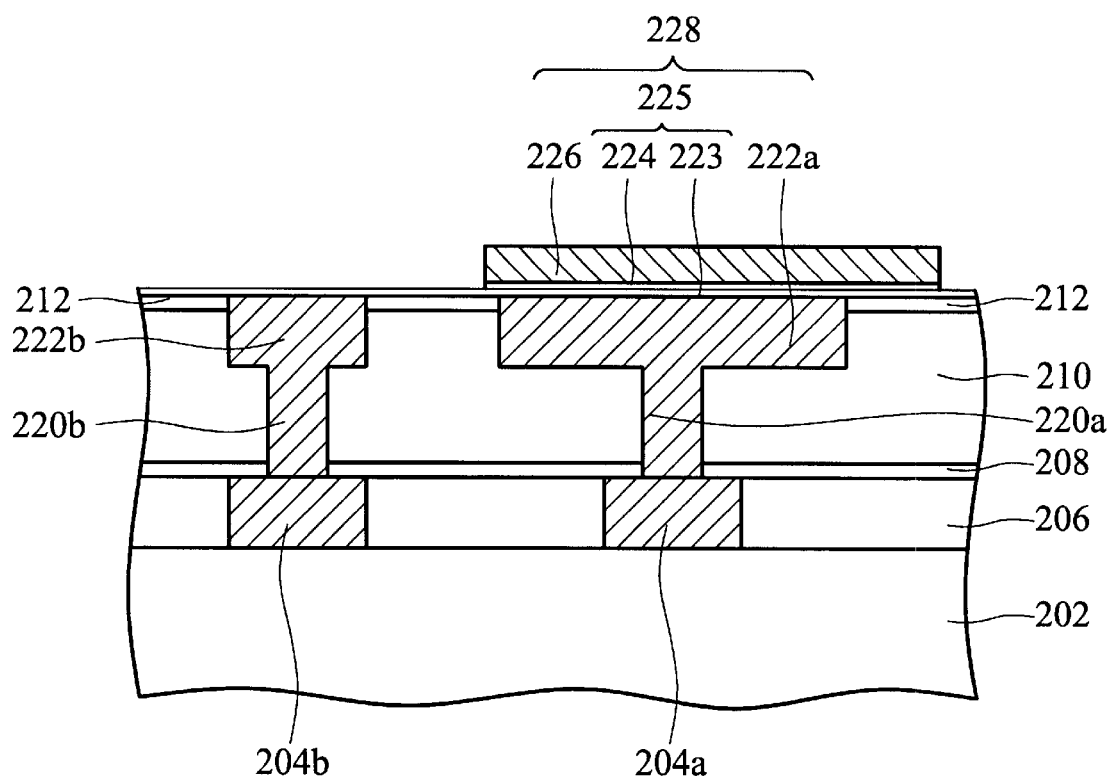

With Reference to FIG. 3D, the metal layer 226 and the insulator 224 are patterned to form an upper electrode 226 and one part of a capacitor insulator 225 by performing photolithography and etching steps until the sealing layer 223 as an etching stop layer is exposed.

According to the above-mentioned steps, only another single mask is required to make the metal capacitor 228. Accordingly, the number of masking and etching steps in manufacturing an integrated circuit including a capacitor is reduced, as are the costs of manufacturing the same.

The capacitor insulator 225 comprises the insulator 224 and the sealing layer 223. The region of the lower electrode 222a is corresponds roughly to that of the upper electrode 226, and the capacitance of the metal capacitor 228 is controlled by the overlap region of the lower electrode 222a and the upper electrode 226. The upper electrode 226, the capacitor insulator 225 and the lower electrode 222a constitute the metal capacitor 228.

Figure 3E:
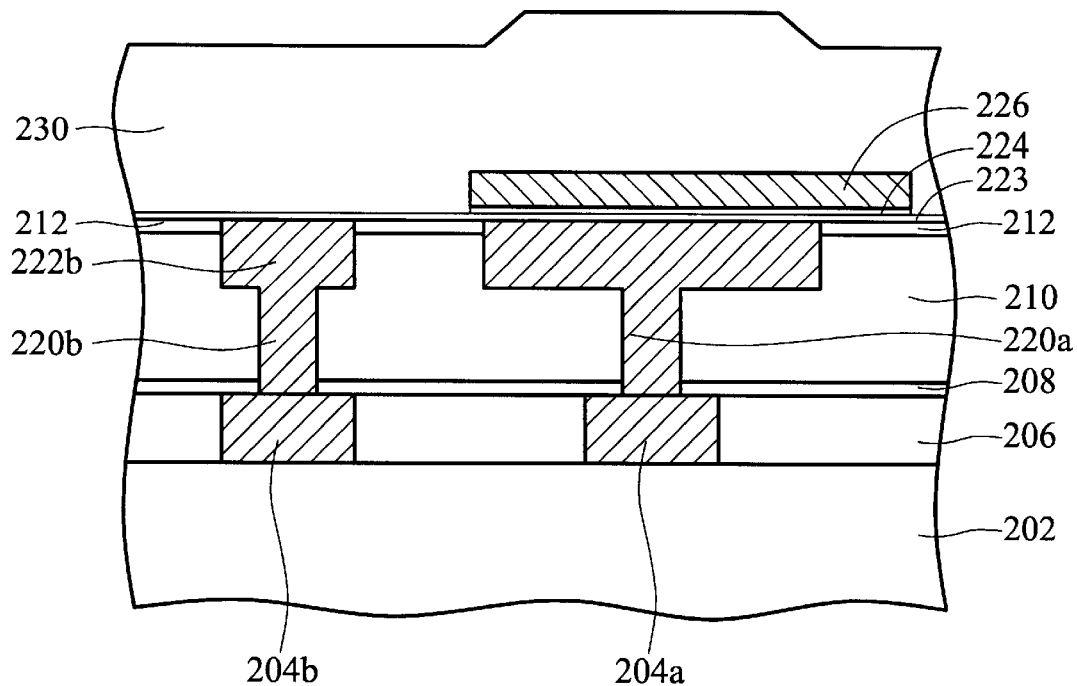
Figure 3F:
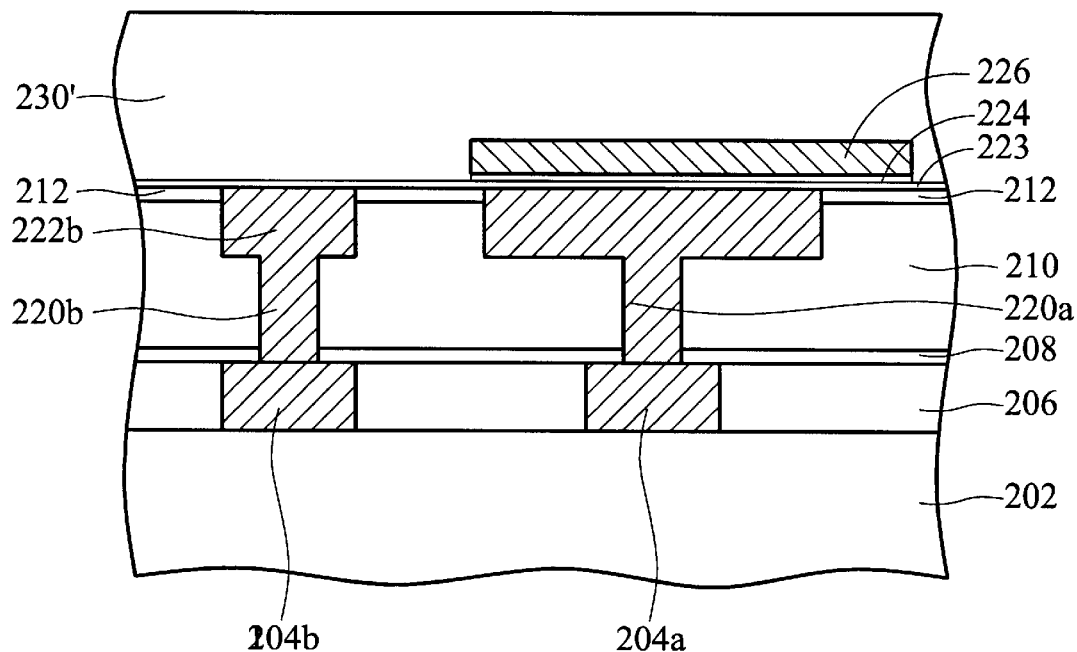

Now turning to FIG. 3E, a blanket sacrificial insulator 23C is formed on the sealing layer 223 and the metal capacitor 228. The blanket, sacrificial insulator 230 is then subjected to a planarization process, such as a chemical mechanical polishing process. Therefore, the sacrificial insulator 230 becomes an insulator 230' having a flat surface to facilitate the following process, as shown in FIG. 3F.

Figure 3G:
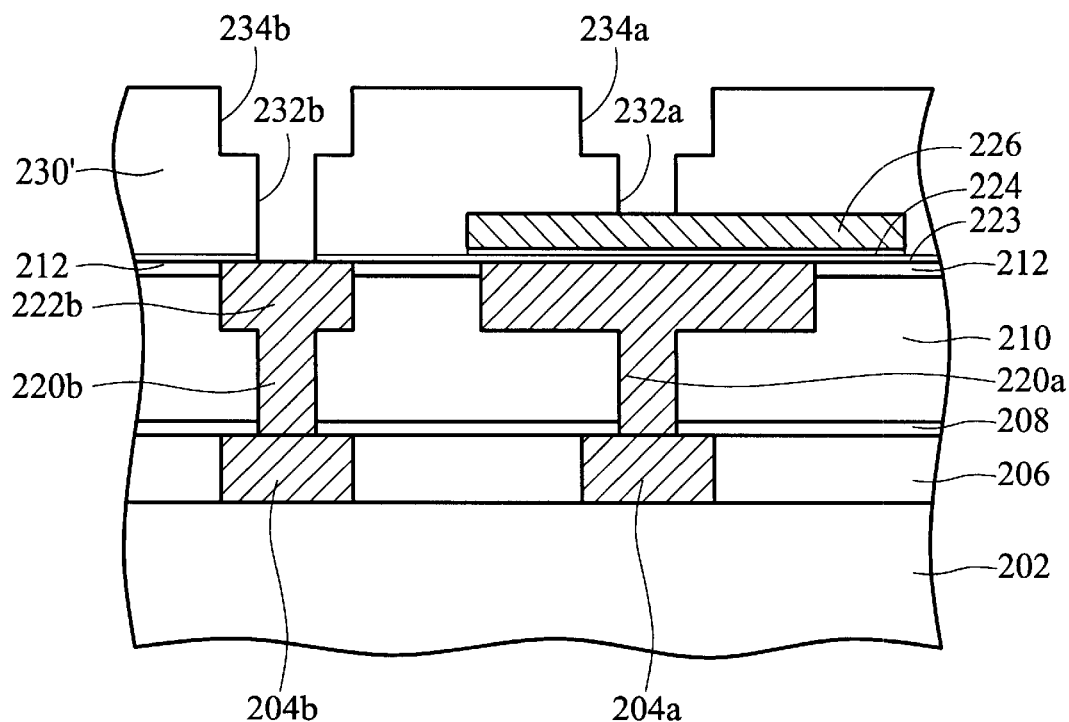
Figure 3H:
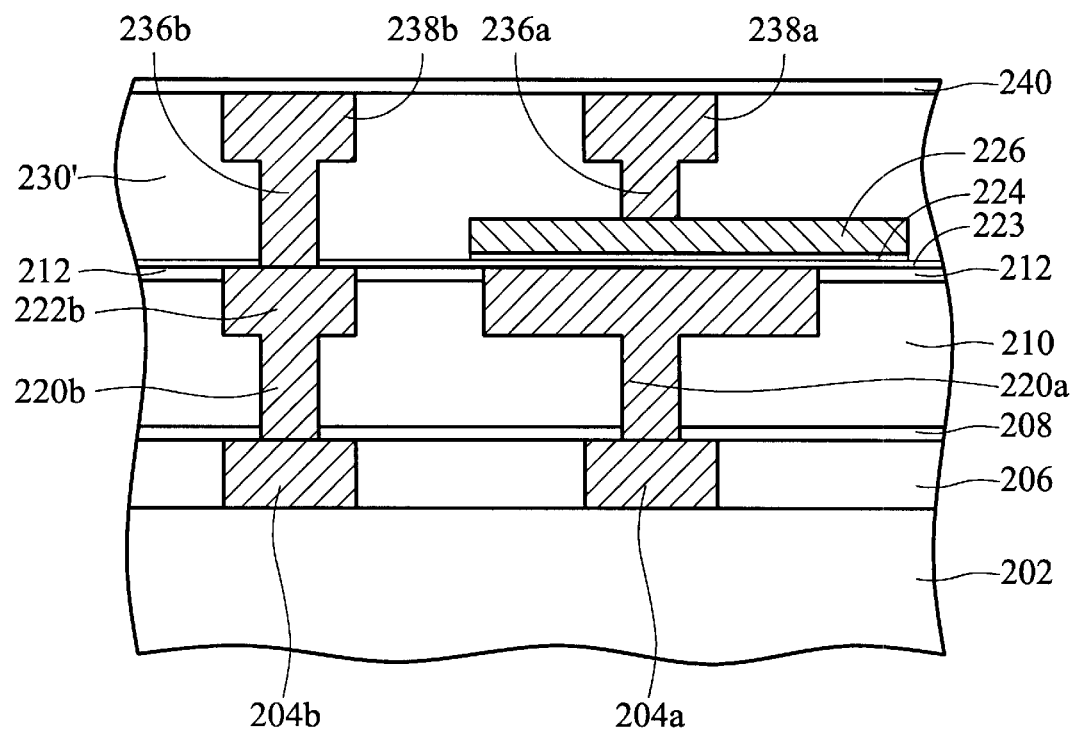

Another dual damascene process is performed, as shown in FIGS. 3G and 3H. Dual damascene patterns comprising vias 232a and 232b and trenches 234a and 234b are formed in the insulator 2301 and the sealing layer 223. The via 232b exposes the surface of the Cu wire 222b, and the via 232a exposes the surface of the upper electrode 226.

Referring to FIG. 3H, a barrier layer (not shown) is conformally formed on the insulator 230' in the trenches 234a and 234b and vias 232a and 232b. Cu metal is formed above the barrier layer and fills the trenches 234a and 234b and vias 232a and 232b. A chemical mechanical polishing process is conducted to remove the unwanted Cu residue and the barrier layer to form dual damascene structures including Cu wires 238a and 238b and Cu plugs 236a and 236b. A sealing layer 240 is formed on the insulator 230' and the Cu wires 238a and 238b. The material used to fabricate the sealing layer 240 can be silicon nitride or silicon carbide. The upper electrode 226 is connected with the Cu wire 238a through the Cu plug 236a, and the Cu wire 222b is connected with the Cu wire 238b through the Cu plug 236b.

The sequential interconnection processes, Cu processes, proceed until the completion of the interconnections.

The above-mentioned insulators 202, 206, 210 and 230 can be formed by low dielectric constant (K) materials, such as doped or undoped silicon oxide, SOP low K material, such as FLARE®, SiLK®, PAE-II® and so on, and CVD low K material, such as Blackdiamond™ (BD™), Coral™, Greendot™, Aurora™ and so on.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A method for forming a metal capacitor in a damascene process, comprising:

providing a first insulator;

forming a first Cu wire and a second Cu wire in the first insulator;

forming a first sealing layer at least on the first and second Cu wires;

forming a second insulator on the first sealing layer;

forming an anti-reflection layer on the second insulator;

forming dual damascene structures including first and second Cu plugs and third and fourth Cu wires in the anti-reflection layer, the second insulator and the first sealing layer, wherein the first Cu plug connects the third Cu wire and the first Cu wire, and the second Cu plug connects the fourth Cu wire and the second Cu wire;

forming a third insulator on the anti-reflection layer and the third and fourth Cu wires;

forming a metal layer on the third insulator;

patterning the metal layer and the third insulator using the anti-reflection layer as an etching stop layer to form an upper electrode and a capacitor insulator corresponding to the third Cu wire;

forming a fourth insulator on the anti-reflection layer and the upper electrode;

forming dual damascene structures including third and fourth Cu plug and fifth and sixth Cu wires in the fourth insulator, wherein the third Cu plug connects the fifth Cu wire and the upper electrode, and the fourth Cu plug connects the sixth Cu wire and the fourth Cu wire; and forming a second sealing layer covering at least the fifth and sixth Cu wires.

2. The method as claimed in claim 1, wherein the material of the anti-reflection layer is selected from the group consisting of silicon oxynitride (SiON), and silicon carbide (SiC).

3. The method as claimed in claim 1, wherein the material of the third insulator is selected from the group silicon nitride ($Si_3N_4$), silicon oxynitride (SiON), silicon carbide (SiC), tantalum oxide ($TaO_2$), zirconium oxide ($ZrO_2$), hafnium oxide ($HfO_2$), and alumium oxide ($Al_2O_3$).

4. The method as claimed in claim 1, wherein the thickness of the third insulator is ranging from 100 Å to 1,200 Å.

5. The method as claimed in claim 1, wherein the material of the metal layer is selected from the group consisting of titanium (Ti), titanium nitride (TiN), tantalum (Ta), tantalum nitride (TaN), aluminum (Al), and aluminum copper alloy (AlCu).

6. The method as claimed in claim 1, wherein the thickness of the metal layer is ranging from 100 Å to 2,000 Å.

7. A method for forming a metal capacitor in a damascene process, comprising:

providing a first insulator;

forming a first Cu wire and a second Cu wire in the first insulator;

forming a first sealing layer at least on the first and second Cu wires;

forming a second insulator on the first sealing layer;

forming an anti-reflection layer on the second insulator;

forming dual damascene structures including first and second Cu plugs and third and fourth Cu wires in the anti-reflection layer, the second insulator and the first sealing layer, wherein the first Cu plug connects the third Cu wire and the first Cu wire, and the second Cu plug connects the fourth Cu wire and the second Cu wire;

forming a second sealing layer on the anti-reflection layer and the third and fourth Cu wires;

forming a third insulator on the second sealing layer;

forming a metal layer on the third insulator;

patterning the metal layer and the third insulator using the second sealing layer as an etching stop layer to form an upper electrode and one part of a capacitor insulator corresponding to the third Cu wire, wherein the second sealing layer is the other part of the capacitor insulator;

forming a fourth insulator on the second sealing layer and the upper electrode;

forming dual damascene structures including third and fourth Cu plug and fifth and sixth Cu wires in the fourth insulator and the second sealing layer, wherein the third Cu plug connects the fifth Cu wire and the upper electrode, and the fourth Cu plug connects the sixth Cu wire and the fourth Cu wire; and forming a third sealing layer at least on the fifth and sixth Cu wires.

8. The method as claimed in claim 7, wherein the material of the anti-reflection layer is selected from the group consisting of silicon oxynitride (SiON), and silicon carbide (SiC).

9. The method as claimed in claim 7, wherein the material of the third insulator is selected from the group silicon nitride ($Si_3N_4$), silicon oxynitride (SiON), silicon carbide (SiC), tantalum oxide ($TaO_2$), zirconium oxide ($ZrO_2$), hafnium oxide ($HfO_2$), and aluminum oxide ($Al_2O_3$).

10. The method as claimed in claim 7, wherein the thickness of the third insulator ranges from 100 Å to 1,200 Å.

11. The method as claimed in claim 7, wherein the material of the metal layer is selected from the group consisting of titanium (Ti), titanium nitride (TiN), tantalum (Ta), tantalum nitride (TaN), aluminum (Al), and aluminum copper alloy (AlCu).

12. The method as claimed in claim 7, wherein the thickness of the metal layer is ranging from 100 Å to 2,000 Å.

* * * * *